(12) United States Patent
Szczesny et al.

(10) Patent No.: US 7,955,093 B2
(45) Date of Patent: Jun. 7, 2011

(54) CONNECTOR ASSEMBLY HAVING ELECTRONIC COMPONENTS MOUNTED THERETO

(75) Inventors: David Stanley Szczesny, Hershey, PA (US); Candace Eileen Gillette, Fremont, CA (US); Randy K. Rannow, Reno, NV (US); Linda Ellen Shields, Camp Hill, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 305 days.

(21) Appl. No.: 12/366,053

(22) Filed: Feb. 5, 2009

(65) Prior Publication Data

US 2010/0197153 A1 Aug. 5, 2010

(51) Int. Cl.
*H01R 12/00* (2006.01)
(52) U.S. Cl. .......................................... 439/74
(58) Field of Classification Search .................. 439/74, 439/876, 497, 722, 709, 567, 395, 931, 65, 439/68, 70; 29/761; 336/192, 200, 208; 361/782, 760, 811
See application file for complete search history.

(56) References Cited

U.S. PATENT DOCUMENTS

| 3,146,419 | A | * | 8/1964 | Warren et al. | 336/192 |
| 5,650,920 | A | * | 7/1997 | Pfizenmayer | 361/782 |
| 7,267,575 | B1 | * | 9/2007 | Hwang | 439/497 |
| 2008/0188145 | A1 | * | 8/2008 | Grueso et al. | 439/876 |

* cited by examiner

*Primary Examiner* — Edwin A. Leon

(57) ABSTRACT

A connector assembly configured to be mounted to a device substrate is provided. She connector assembly includes a connector substrate, an electronic component. contacts, and conductive wires. The connector substrate has a mounting side and an opposite supporting side interconnected by an edge. The mounting side is used to mount the connector substrate to the device substrate. The electronic component is disposed on the supporting side of the connector substrate. The contacts are provided on the mounting side of the connector substrate and are used to electrically couple the electronic component with the device substrate. The wires are joined to the electronic component and to the contacts. The wires extend along the supporting and mounting sides and wrap around the edge of the connector substrate. The conductive wires are separated from one another by a separation gap along the supporting side and the mounting side of the connector substrate.

20 Claims, 3 Drawing Sheets

CONNECTOR ASSEMBLY HAVING ELECTRONIC COMPONENTS MOUNTED THERETO

BACKGROUND OF THE INVENTION

The subject matter herein relates generally to electrical connectors, and more particularly, to electrical connectors that have electronic components and can be mounted to a substrate of a device.

Some known connectors include electronic components that process signals communicated through the connectors. For example, some connectors include magnetic or ferrite components such as transformers that filter data signals received by the connector. Contacts on one side of the connector receive the data signals from a device and communicate the signals to the magnetic or ferrite component on the connector. After the signals are filtered by the magnetic component, the signals are communicated to other contacts on another side of the connector and sent back to a receiving device.

Some of the known connectors have the contacts that receive and send signals on the same side of the connector as the magnetic component. For example, the connectors may have a mounting side that is mounted onto a circuit board of the device, and an opposite supporting side on which the contacts and the magnetic component are provided. Placing both the magnetic component and the contacts on the same side of the connector may limit the number of contacts or magnetic components that may be included in the connector. For example, the overall size of the mounting and supporting sides of the connector may be limited, and including both the magnetic component and the contacts on the same side can reduce the total number of contacts and magnetic components that can be included in the connector. Other known connectors provide the contacts on edges that interconnect the mounting and supporting sides of the connector. However, the sizes of the edges also may be limited, thus limiting the number of contacts that may be provided on the connector.

The need for a greater number of contacts, increased electrical isolation, and/or more functionality in the electronic components increases as the need For increased computing speed grows in the same or reduced size package. As described above, known connectors may have space limitations that limit the total number of contacts and electronic components that may be included in each connector. Therefore, the space limitations of known connectors also may limit the efficacy of the connectors in new and improved devices.

A need exists for a connector that is mountable to a device substrate and has a more efficient distribution of contacts and electronic components on the connector.

BRIEF DESCRIPTION OF THE INVENTION

In one embodiment, a connector assembly that is configured to be mounted to a device substrate is provided. The connector assembly includes a connector substrate, an electronic component, contacts, and conductive wires. The connector substrate has a mounting side and an opposite supporting side interconnected by an edge. The mounting side is used to mount the connector substrate to the device substrate. The electronic component is disposed on the supporting side of the connector substrate. The contacts are provided on the mounting side of the connector substrate and are used to electrically couple the electronic component with the device substrate. The wires are joined to the electronic component and to the contacts. The wires extend along the supporting and mounting sides and wrap around the edge of the connector substrate. The conductive wires are separated from one another by a separation gap along the supporting side and the mounting side of the connector substrate.

In another embodiment, another connector assembly is configured to be mounted to a device substrate. The connector assembly includes a connector substrate, an electronic component, contacts and wires. The connector substrate has an exterior surface that includes a mounting side and a supporting side interconnected by opposite edges. The mounting side is used to mount the connector substrate to the device substrate. The electronic component is disposed on the supporting side of the connector substrate. The contacts are provided on the mounting side of the connector substrate for electrically coupling the electronic component with the device substrate. The wires are joined to the electronic component and to the contacts. Each of the wires extends along the exterior surface of the supporting and mounting sides and wraps around at least one of the edges of the connector substrate in a plane common to the wire.

DETAILED DESCRIPTION OF THE INVENTION

Figure 1:
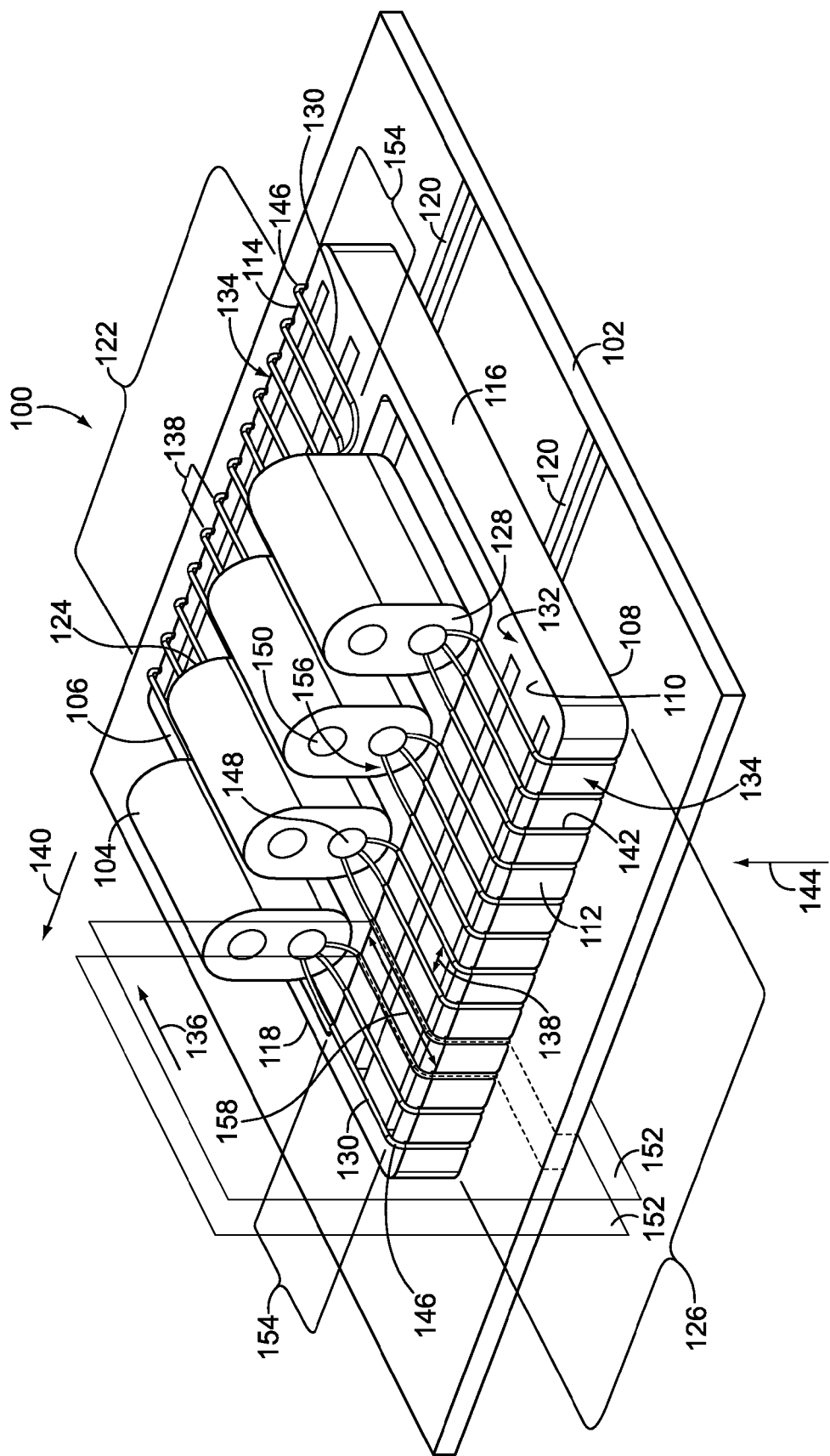
FIG. 1 is a perspective view of a connector assembly formed in accordance with one embodiment.

FIG. 1 is a perspective view of a connector assembly 100 formed in accordance with one embodiment. The connector assembly 100 is mounted to a device substrate 102. For example, the connector assembly 100 may be mounted to a printed circuit board. The connector assembly 100 shown in FIG. 1 includes several electronic components 104 that communicate signals through the connector assembly 100. In one embodiment, the electronic components 104 are magnetic or ferrite electronic components. For example, the electronic components 104 may be transformers that filter signals communicated using the connector assembly 100. In another example, the electronic components 104 may be common-mode chokes or other ferrite devices. A first group 122 of conductors 130 may communicate signals to an upper coil 150 in each electronic component 104 while a second group 126 of conductors 130 communicates the signals from a lower coil 148 in each electronic component 104 to the device substrate 102. Alternatively, the electronic components 104 may be embodied in one or more different devices or apparatuses that communicate signals through the connector assembly 100. The conductors 130 are partially shielded wires in the illustrated embodiment. For example, the conductors 130 include elongated wires having a circular cross-section that are at least partially encapsulated by a dielectric sheath or covering. Alternatively, the conductors 130 may be unshielded wires. Using wires instead of other conductors such as conductive traces permits the conductors 130 to be wrapped around the exterior of a connector substrate 106.

The connector substrate 106 may be formed from a dielectric material. For example, the connector substrate 106 may be homogeneously formed as a unitary body from a polymer.

The connector substrate 106 may have a substantially planar body as shown in FIG. 1, or the connector substrate 106 may have a non-planar body. The connector substrate 106 extends between a mounting side 108 and an opposite supporting side 110. The mounting and supporting sides 108, 110 may be approximately parallel to one another. The mounting and supporting sides 108, 110 are joined by several edges 112, 114, 116, 118. The edges 112 and 114 opposite to each other and the edges 116 and 118 are opposite to each other. In the illustrated embodiment, the edges 112, 114 are parallel to each other and the edges 116, 118 are parallel to one another, with each of the edges 112, 114 intersecting each of the edges 116, 118 at corners of the connector substrate 106. Alternatively, the edges 112, 114, 116, 118 may be rounded or have a different shape than is shown in FIG. 1.

The mounting side 108 of the connector substrate 106 is mounted to and electrically coupled with the device substrate 102. The mounting side 108 may be electrically connected with conductive pathways 120 in the device substrate 102. For example, the connector substrate 106 may be electrically coupled with conductive traces in a circuit board. The first group 122 of conductors 130 provides conductive pathways between contacts 204 (shown in FIG. 2) and one end 124 of the electronic components 104, and the second group 126 of conductors 130 provides conductive pathways between the contacts 204 (shown in FIG. 2) and an opposite end 128 of the electronic components 104. The conductors 130 include opposite conductor ends 156, 232 (shown in FIG. 2). The first conductor end 156 may be electrically joined to the electronic components 104 and the second, opposite conductor end 232 may be electrically joined to a contact 204. The conductors 130 are wrapped around an exterior surface 132 of the supporting side 110 and an exterior surface 134 of each of the opposite edges 112, 114 of the connector substrate 106 in the illustrated embodiment. For example, the conductors 130 may include upper bends 146 proximate to the intersection of the supporting side 110 with each of the edges 112, 114. The upper bends 146 wrap the conductors 130 from extending above and alongside the supporting side 110 to extending outside of and alongside the edges 112, 114. The upper bends 146 may be bends of approximately ninety degrees. The upper bends 146 may be provided to prevent passing the conductors 130 through the connector substrate 106. For example, the conductors 130 do not extend from the supporting side 110 to the mounting side 108 through vias or channels in the connector substrate 106 located away from the edges 112, 114, 116, 118. As shown in FIG. 1 and described below, the conductors 130 are wrapped around the connector substrate 106 from the supporting side 110 to the mounting side 108 through slots 142 located at the edges 112, 114.

The conductors 130 in each group 122, 126 may be positioned on the supporting side 110 such that the conductors 130 in each group 122, 126 are aligned with respect to one another along a first direction 136 that extends parallel to the supporting side 110. Alternatively, the conductors 130 in one of the two groups 122, 126 may be aligned along a direction other than the first direction 136. For example, the conductors 130 in the group 122 and the conductors 130 in the group 126 may be disposed parallel to one another above the supporting side 110 for at least a portion 154 of the supporting side 110. The portion 154 of the supporting side 110 includes the part of the supporting side 110 that the conductors 130 are located proximate to the supporting side 110. For example, the portion 154 may represent the area of the supporting side 110 that the conductors 130 are approximately parallel to the plane defined by the supporting side 110. The portion 154 extends across the supporting side 110 of the connector substrate 106 by a surface dimension 158. The surface dimension 158 represents the distance that the portion 154 extends across the supporting side 110 in the first direction 136. The size of the portion 154 may be varied to adjust a footprint 304 (shown in FIG. 3) of the connector substrate 106. For example, the portion 154 may be reduced in size to reduce the surface area of the device substrate 102 that is covered by the connector substrate 106 when the connector substrate 106 is mounted to the device substrate 102. The portion 154 also may be reduced to reduce the noise in signals communicated using the conductors 130. For example, reducing the portion 154 reduces the length of the conductors 130 over which signals travel in the connector assembly 100. Reducing the length of the conductors 130 over which the signals travel in the connector assembly 100, in turn, reduces the noise in signals communicated between the contacts 204 and the electronics packages 104.

In one embodiment, the conductors 130 may be adjacent to the supporting side 110 throughout the portion 154 and move farther from the portion 154 in order to be terminated to the electronic components 104. The conductors 130 in each group 122, 126 may be separated from one another by a separation gap 138 in a second direction 140 that is transverse to the first direction 136. The separation gap 138 may be substantially consistent between the conductors 130 in each group 122, 126 along the supporting side 110 and the edges 112, 114 of the connector substrate 106. Alternatively, the separation gap 138 between the conductors 130 in one or more of the groups 122, 126 may vary in one or more of the groups 122, 126.

The conductors 130 in the illustrated embodiment are wrapped around the connector substrate 106 such that each conductor 130 is positioned within a single plane as the conductor 130 extends above the supporting side 110, one of the edges 112, 114 and the mounting side 108. For example, each conductor 130 may be positioned along the supporting side 110, one of the edges 112, 114 and the mounting side 108 such that each conductor 130 remains within a respective plane 152. The respective planes 152 are transverse to the device substrate 102 and may be separated by the separation gap 138 along the second direction 140. For example, the respective planes 152 may be approximately perpendicular to the device substrate 102 and separated from one another by the separation gap 138 for the conductors 130 in each group 122, 126. Wrapping the conductors 130 around the exterior of the connector substrate 106 may permit the separation gap 138 between the conductors 130 to be maintained as the conductors 130 extend through the portion 154 of tie supporting side 110, one of the edges 112, 114 and along the mounting side 108. For example, wrapping the conductors 130 around the outside of the connector substrate 106 may enable the conductors 130 to consistently be separated from one another such that the electrical impedance characteristic of the connector assembly 100 is approximately constant throughout the device substrate 106, the conductors 130 and the electronic components 104.

The edges 112, 114 include slots 142 that extend in a third direction 144 along the edges 112, 114. In one embodiment, the directions 136, 140, 144 are transverse to one another. For example, the directions 136, 140, 144 may be approximately perpendicular to one another. The slots 142 may be formed as recesses in the edges 112, 114 and shaped to receive the conductors 130. The slots 142 may be separated by the separation gap 138 in order to maintain the separation gap 138 between the conductors 130 across the edges 112, 114. Adjusting the positions of the slots 142 may adjust the electrical impedance of the connector assembly 100. For example, increasing or decreasing the separation gap 138 between the slots 142 may change the electrical impedance of the connector assembly 100. The positions of the slots 142 may be established to approximately match the electrical impedance of the connector assembly 100 with the impedance of the system that includes the connector assembly 100 and the device substrate 102. For example, the slots 142 may be positioned to reduce or eliminate an impedance spike caused by the connector assembly 100.

Figure 2:
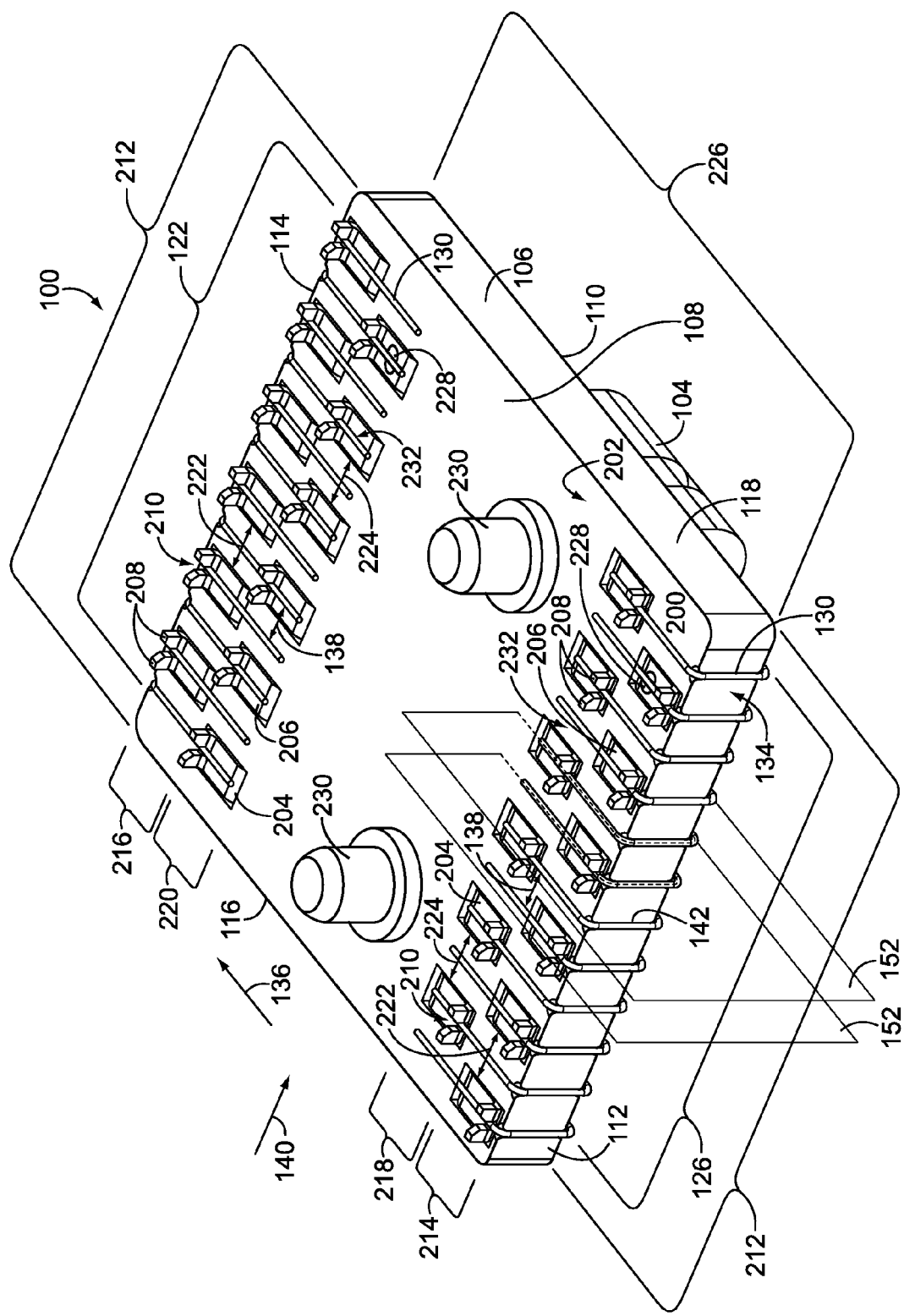
FIG. 2 is a perspective view of a mounting side of the connector assembly shown in FIG. 1 that is implemented according to one embodiment.

FIG. 2 is a perspective view of the mounting side 108 of the connector assembly 100 that, is implemented according to one embodiment. As shown in FIG. 2, the conductors 130 extend along the mounting side 108 from the interfaces between the mounting side 108 and each of the edges 112, 114 to contacts 204. The second conductor end 232 of each conductor 130 is joined or terminated to one of the contacts 204. The contacts 204 may be located to increase routing efficiencies of the conductors 130, to provide high voltage potential isolation of the conductors 130 from one another, and/or to separate the conductors 130 from each other to ensure signal integrity or electrical performance. The conductors 130 may extend along the mounting side 108 to the contacts 204 along directions that are approximately parallel to the direction 136. As described above, each of the conductors 130 is located in a respective plane 152 along each of the supporting side 110, one of the edges 112, 114 and along the mounting side 108 in the illustrated embodiment. The conductors 130 may extend beyond the contacts 204 or may end at the contacts 204. For example, the conductors 130 that are terminated to a first set 214 or a second set 216 of contacts 204 may include portions that extend beyond the contacts 204, while the conductors 130 that are terminated to a third set 218 or a fourth set 220 of contacts 204 may end at the contacts 204. Each of the first through fourth sets 214-220 of contacts 204 may include contacts 204 that are linearly aligned along a direction parallel to the direction 140. The contacts 204 in the first and second sets 214, 216 may be located closer to the edges 112, 114 than the contacts 204 in the third and fourth sets 218, 220. The conductors 130 may be terminated to the contacts 204 to provide a conductive coupling or bond between the conductors 130 and the contacts 204. For example, the conductors 130 may be welded to the contacts 204 using a welded connection 228. Alternatively, the conductors 130 may be soldered to the contacts 204.

The conductors 130 include lower bends 200 proximate the intersection of the mounting side 108 with each of the edges 112, 114. The lower bends 200 permit the conductors 130 to extend along the exterior surfaces 134 of the edges 112, 114 and an exterior surface 202 of the mounting side 108. For example, as shown in FIGS. 1 and 2, the conductors 130 may include the bends 146 proximate the supporting side 110 and the bends 200 proximate the mounting side 108 such that the conductors 130 are wrapped around the exterior of the connector substrate 106 between the electronic components 104 on the supporting side 110 and the contacts 204 on the mounting side 108.

The contacts 204 include bonding pads 206 and alignment fingers 208. The bonding pad 206 and alignment fingers 208 may be integrally formed as a unitary body. For example, the bonding pad 206 and alignment fingers 208 for each contact 204 may be stamped and formed from a sheet of conductive material. The bonding pads 206 are approximately coplanar with the mounting side 108 in the illustrated embodiment. Optionally, the bonding pads 206 may be recessed into the mounting side 108 or protrude from the mounting side 108. The conductors 130 are electrically joined to the contacts 204 at the bonding pads 206. For example, the conductors 130 may be soldered or otherwise terminated to the contacts 204 at the bonding pads 206, as described above.

The alignment fingers 208 protrude from the mounting side 108 away from the bonding pads 206 of the contacts 204. In the illustrated embodiment, each contact 204 includes a pair of the alignment fingers 208 separated by an alignment slot 210. The conductors 130 are received in the alignment slots 210 to align the conductors 130 with respect to the contact 204. For example, the alignment fingers 208 may ensure that the conductors 130 are aligned with the bonding pads 206 such that the conductors 130 may be bonded to the contacts 204 at the bonding pads 206. The alignment fingers 208 may maintain the separation gap 138 between the conductors 130. The alignment slots 210 maybe separated by the separation gap 138 along the direction 140 to maintain the separation of the conductors 130. The slots 142 and the alignment fingers 208 assist in controlling the location of the conductors 130 as the conductors 130 are wrapped around the connector substrate 106. The slots 142 and alignment fingers 208 determine where the individual conductors 130 are located on the connector substrate 106. The slots 142 and alignment fingers 208 may control the locations of the conductors 130 to establish a predetermined or desired electrical impedance characteristic of the connector assembly 100. The slots 142 and alignment fingers 208 also may provide repeatability in the manufacturing of several connector assemblies 100. For example, the slots 142 and alignment ringers 208 provide mechanisms for ensuring that the locations of the conductors 130 are the same or approximately the same for each of several connector assemblies 100.

The contacts 204 may be provided in a staggered arrangement or pattern to increase the number of contacts 204 provided on the mounting side 108 of the connector substrate 106. For example, the sets 218, 220 of contacts 204 are disposed farther from the edges 112, 114 of the connector substrate 106 than the sets 214, 216 of contacts 204. Staggering the contacts 204 may provide additional control over the electrical impedance characteristic of the connector assembly 100 while maintaining the size of the footprint 304 (shown in FIG. 3) of the connector assembly 100. The contacts 204 in the sets 214, 216 are aligned linearly along the direction 140 with gaps 222 between the contacts 204 in the sets 214, 216 in the illustrated embodiment. Similarly, the contacts 204 in the sets 218, 220 are aligned linearly along the direction 140 with gaps 224 between the contacts 204 in the sets 218, 220. The direction 140 is substantially parallel to the edges 112, 114. Staggering the contacts 204 may increase the number of contacts 204 that may be fitted on the footprint 304 (shown in FIG. 3) of the mounting side 108. The footprint 304 of the mounting side 108 represents the area of the device substrate 102 that is encompassed by the connector assembly 100 when the connector assembly 100 is mounted to the device substrate 102. The footprint 304 of the mounting side 108 may be defined by the length 212 and width 226 of the mounting side 108. The length 212 extends along each of the edges 112, 114 of the connector substrate 106 and may be measured along the direction 140. The width 226 extends along each of the edges 116, 118 and may be measured along the direction 136. Staggering the contacts 204 may provide for an increased number of contacts 204 to be positioned in the footprint 304 of the mounting side 108 while keeping the footprint 304 of the mounting side 108 approximately the same as the footprint 304 of the supporting side 110.

The connector substrate 106 may include alignment pins 230 that protrude from the mounting side 108. The alignment pins 230 may be received in alignment cavities 302 (shown in FIG. 3) in the device substrate 102 (shown in FIG. 1). The alignment pins 230 may be received in the alignment cavities 302 to align the connector substrate 106 with respect to the device substrate 102.

Figure 3:
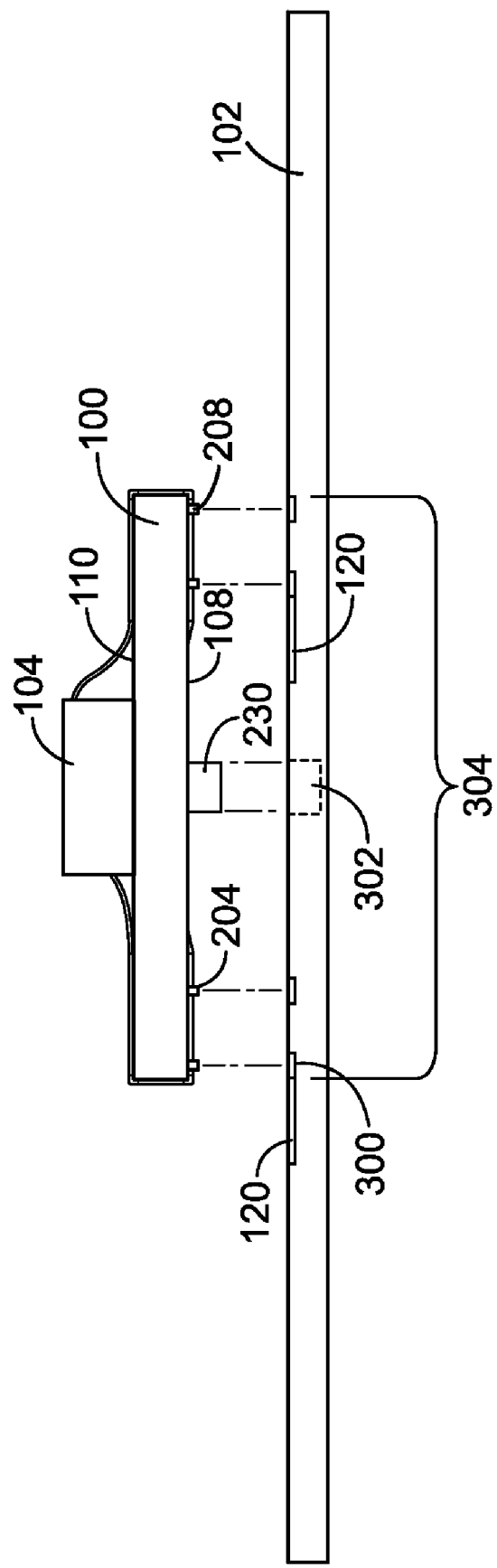
FIG. 3 is plan view of the connector assembly shown in FIG. 1 prior to mounting the connector assembly to the device substrate also shown in FIG. 1 in accordance with one embodiment.

FIG. 3 is plan view of the connector assembly 100 prior to mounting the connector assembly 100 to the device substrate 102 in accordance with one embodiment. The device, substrate 102 includes several surface contacts 300 that engage the contacts 204 of the connector assembly 100 in order to electrically couple the device substrate 102 with the connector assembly 100. In one embodiment, the surface contacts 300 are conductive surface pads on the device substrate 102. The surface contacts 300 may be electrically joined with the conductive pathways 120 in the device substrate 102. The contacts 204 of the connector assembly 100 may be soldered to tile surface contacts 300 of the device substrate 102 to electrically join the contacts 204 and the surface contacts 300. Alternatively, the surface contacts 300 may be provided as solder balls in a ball grid array (BGA) that approximately matches the arrangement of the contacts 204 in the connector assembly 100. For example, the surface contacts 300 may be staggered such that the contacts 204 each join with one of the surface contacts 300 to permit electronic communication between the device substrate 102 and the connector assembly 100. In another embodiment, the surface contacts 300 may be cavities in the device substrate 102 that are plated with a conductive material and that are positioned to receive the contacts 204. The alignment fingers 208 of the contacts 204 may protrude from the connector substrate 106 such that the alignment fingers 208 engage, or are received in, the surface contacts 300. For example, the alignment fingers 208 may be received in solder balls in a BGA and then soldered to the device substrate 102 in order to affix the connector assembly 100 to the device substrate 102.

The device substrate 102 includes alignment cavities 302 that are shaped and positioned to receive the alignment pins 230 of the connector assembly 100. The alignment cavities 302 may be positioned with respect to the surface contacts 300 such that the alignment fingers 208 of the contacts 204 are aligned with respect to the surface contacts 300 when the alignment pins 230 are received in the alignment cavities 302.

As described above, the area on the device substrate 102 that is encompassed by the connector assembly 100 when the connector assembly 100 is mounted to the device substrate 102 is referred to as the footprint 304 of the connector assembly 100. The footprint 304 of the connector assembly 100 may be reduced by positioning the contacts 204 on the mounting side 108 of the connector assembly 100 while locating the electronic components 104 on the supporting side 110 of the connector assembly 100. For example, placing the contacts 204 and the electronic components 104 on opposite sides of the connector assembly 100 may enable the contacts 204 and the electronic components 104 to overlap each other and be located within the same footprint 304.

Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "First," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of farther structure.

What is claimed is:

1. A connector assembly configured to be mounted to a device substrate, the connector comprising:
    a connector substrate having a mounting side and an opposite supporting side interconnected by an edge, the mounting side for mounting the connector substrate to the device substrate;
    an electronic component disposed on the supporting side of the connector substrate;
    contacts on the mounting side of the connector substrate for electrically coupling the electronic component with the device substrate; and
    conductive wires joined to tile electronic component and to the contacts, the wires extending along the supporting and mounting sides and wrapping around the edge of the connector substrate, wherein the conductive wires are separated from one another by a separation gap along the supporting side and the mounting side of the connector substrate.

2. The assembly of claim 1, wherein the electronic component and the contacts are located within a common footprint of the connector assembly on the device substrate.

3. The assembly of claim 1, wherein the contacts are provided in a staggered arrangement on the mounting side of the connector substrate.

4. The assembly of claim 1, wherein the contacts are disposed in at least two sets extending linearly and parallel to the edge, wherein tile at least two sets are disposed at respective different distances from the edge.

5. The assembly of claim 1, wherein the contacts are disposed between the mounting side of the connector substrate and the device substrate when the connector substrate is mounted to the circuit board.

6. The assembly of claim 1, wherein the conductive wires extend from opposite ends of the electronic component towards the edge of the connector substrate and towards an opposite edge of the connector substrate, the conductors wrapping around the edges and extending to the contacts to electrically couple the contacts with the electronic component.

7. The assembly of claim 1, wherein each wire is disposed within a respective plane as the wire extends along the supporting surface, the mounting surface and the edge of the connector substrate.

8. The assembly of claim 1, wherein the edge of the connector substrate includes slots extending transverse to the mounting side and the supporting side and shaped to receive the wires.

9. The assembly of claim 1, wherein the contacts include fingers protruding from the mounting side of the connector substrate, the fingers engaging the device substrate to electrically couple the electronic component and the device substrate.

10. The assembly of claim 1, wherein each of the contacts includes alignment fingers protruding from the mounting side of the connector substrate, the alignment fingers for each contact receiving a corresponding one of the wires to align the wire with respect to the contact.

11. The assembly of claim 1, wherein the electronic component is a transformer.

12. A connector assembly configured to be mounted to a device substrate, the connector comprising:
- a connector substrate having an exterior surface that includes a mounting side and a supporting side interconnected by opposite edges, the mounting side for mounting the connector substrate to the device substrate;
- an electronic component disposed on the supporting side of the connector substrate;
- contacts on the mounting side of the connector substrate for electrically coupling the electronic component with the device substrate; and
- wires joined to the electronic component and to the contacts, each of the wires extending along the exterior surface of the supporting and mounting sides and wrapping around at least one of the edges of the connector substrate in a plane common to the wire.

13. The assembly of claim 12, wherein at least one of the edges includes slots that receive the wires to maintain a separation gap between the wires.

14. The assembly of claim 12, wherein the electronic component and the contacts are located within a common footprint of the connector assembly on the device substrate.

15. The assembly of claim 12, wherein the contacts are provided in a staggered arrangement on the mounting side of the connector substrate.

16. The assembly of claim 12, wherein the contacts are linearly aligned with respect to one another in each of first and second sets, the contacts in the first set being disposed at a different distance from one of the edges of the connector substrate than the contacts in the second set.

17. The assembly of claim 16, wherein the contacts in the first and second sets are positioned in an alternating pattern such that each pair of adjacent wires includes one wire joined to a contact in the first set and one wire joined to a contact in the second set.

18. The assembly of claim 12, wherein each of the contacts includes alignment fingers protruding from the mounting side of the connector substrate, the alignment fingers for each contact receiving a corresponding one of the wires to align the wire with respect to the contact.

19. The assembly of claim 12, wherein the electronic component is a transformer.

20. The assembly of claim 12, wherein the wires are separated from one another by a separation gap along at least a portion of the supporting surface, the corresponding edge, and the mounting surface of the device substrate.

* * * * *